(12) United States Patent
Kadota et al.

(10) Patent No.: US 8,704,326 B2
(45) Date of Patent: Apr. 22, 2014

(54) THIN-FILM PHOTOELECTRIC CONVERSION DEVICE AND METHOD FOR PRODUCTION THEREOF

(75) Inventors: Naoki Kadota, Otsu (JP); Toshiaki Sasaki, Otsu (JP)

(73) Assignee: Kaneka Corporation, Osaka-shi (JP)

( * ) Notice: Subject to any disclaimer, the term of this patent is extended or adjusted under 35 U.S.C. 154(b) by 0 days.

(21) Appl. No.: 13/580,949

(22) PCT Filed: Jan. 27, 2011

(86) PCT No.: PCT/JP2011/051623
§ 371 (c)(1),
(2), (4) Date: Aug. 23, 2012

(87) PCT Pub. No.: WO2011/105160
PCT Pub. Date: Sep. 1, 2011

(65) Prior Publication Data
US 2012/0319111 A1    Dec. 20, 2012

(30) Foreign Application Priority Data

Feb. 24, 2010  (JP) .................................. 2010-038039

(51) Int. Cl.
*H01L 31/0232* (2006.01)
(52) U.S. Cl.
USPC .................. 257/458; 257/431; 257/E31.127; 257/E31.043; 438/249
(58) Field of Classification Search
USPC .................. 136/246; 438/249; 257/431, 458, 257/E31.127, E31.043
See application file for complete search history.

(56) References Cited

U.S. PATENT DOCUMENTS 7,851,695 B2 * 12/2010 Sawada et al. ................ 136/252
7,999,309 B2 *  8/2011 Yoon et al. .................... 257/328
(Continued)

FOREIGN PATENT DOCUMENTS

| JP | 2009152265    | 7/2009 |
| JP | 2009152265 A  | 7/2009 |
| WO | 2008123691 A2 | 10/2008 |

OTHER PUBLICATIONS

Niu, X. et al., "Nanocrystalline Germanium and Germanium Carbide Films and Devices," Materials Research Society Symposium 2005, Mar. 30, 2005, 6 pages.

(Continued)

*Primary Examiner* — Michael Shingleton
(74) *Attorney, Agent, or Firm* — Alleman Hall McCoy Russell & Tuttle LLP

(57) ABSTRACT

A thin-film photoelectric conversion device includes a crystalline germanium photoelectric conversion layer having improved open circuit voltage, fill factor, and photoelectric conversion efficiency for light having a longer wavelength. The photoelectric conversion device comprises a first electrode layer, one or more photoelectric conversion units, and a second electrode layer sequentially stacked on a substrate, wherein each of the photoelectric conversion units comprises a photoelectric conversion layer arranged between a p-type semiconductor layer and an n-type semiconductor layer. At least one of the photoelectric conversion units includes a crystalline germanium photoelectric conversion layer comprising a crystalline germanium semiconductor that is substantially intrinsic or weak n-type and is essentially free of silicon. A first interface layer which is a substantially intrinsic amorphous silicon semiconductor layer is arranged between the p-type semiconductor layer and the crystalline germanium photoelectric conversion layer.

14 Claims, 4 Drawing Sheets

(56) References Cited

U.S. PATENT DOCUMENTS

| | | | |
|---|---|---|---|
| 8,557,688 B2* | 10/2013 | Lin et al. ................... | 438/488 |
| 2005/0145972 A1* | 7/2005 | Fukuda et al. ............. | 257/458 |
| 2009/0133753 A1* | 5/2009 | Sasaki et al. .............. | 136/261 |
| 2010/0171119 A1* | 7/2010 | Nasuno et al. ............. | 257/53 |
| 2010/0275981 A1 | 11/2010 | Ohmi et al. | |
| 2011/0041901 A1* | 2/2011 | Shim et al. ................ | 136/255 |
| 2011/0048499 A1* | 3/2011 | Myong ....................... | 136/246 |
| 2011/0073162 A1* | 3/2011 | Kikuchi et al. ............. | 136/246 |
| 2011/0146756 A1* | 6/2011 | Sasaki et al. .............. | 136/246 |
| 2011/0253213 A1* | 10/2011 | Park et al. ................. | 136/256 |
| 2012/0060606 A1* | 3/2012 | Lakich et al. .............. | 73/514.16 |

OTHER PUBLICATIONS

ISA Japan, International Search Report of PCT/JP2011/051623, May 17, 2011, WIPO, 1 page.

ISA International Bureau of WIPO, International Preliminary Report on Patentability of PCT/JP2011/051623, Jan. 27, 2011, Switzerland, 5 pages.

* cited by examiner 7, 8, 9, 10, 12

11

THIN-FILM PHOTOELECTRIC CONVERSION DEVICE AND METHOD FOR PRODUCTION THEREOF

TECHNICAL FIELD

The invention relates to a thin-film photoelectric conversion device, and method for production thereof.

BACKGROUND ART

In view of the concern that energy problems and environmental problems will become serious in the future, development of alternative energies that replace fossil fuels has been eagerly carried out. Among the candidates for alternative energy sources, a photoelectric conversion device that converts light into electricity by using a photoelectric effect inside of a semiconductor is attracting attention, and a thin-film photoelectric conversion device using a silicon-based thin-film as a photoelectric conversion layer has been widely researched and developed.

The photoelectric conversion layer is a layer that absorbs light to generate an electron and positive hole pair, and thus its absorption property correlates well with an electrical generation property of the thin-film photoelectric conversion device. For example, when a silicon-based thin-film is used as the photoelectric conversion layer, the absorption of light in the photoelectric conversion layer is not sufficient for a wavelength longer than 1000 nm, so that the power generation efficiency of the thin-film photoelectric conversion device decreases considerably. On the other hand, solar light that lands on the Earth's surface contains light having a wavelength longer than 1000 nm, so that there has been demand for development of a thin-film photoelectric conversion device capable of efficiently performing photoelectric conversion for light having a wavelength longer than 1000 nm and for making a more efficient thin-film photoelectric conversion device.

With respect to the thin-film photoelectric conversion device, Non-Patent Document 1 discloses a single-junction photoelectric conversion device using a weak n-type microcrystalline germanium as a photoelectric conversion layer in an attempt to improve a photoelectric conversion efficiency for light having longer wavelength. The thin-film photoelectric conversion device has a structure in which a stainless substrate/n-type amorphous silicon/i-type amorphous silicon/a gradient composition layer of microcrystalline silicon germanium/a weak n-type microcrystalline germanium photoelectric conversion layer/a gradient composition layer of microcrystalline silicon germanium/a p-type microcrystalline silicon layer/Indium Tin Oxide (ITO) are successively stacked. The characteristics of the thin-film photoelectric conversion device are: open circuit voltage Voc=0.22 V, short circuit current density Jsc=25 mA/cm$^2$, fill factor FF=0.36, and conversion efficiency Eff=2.0%, and the wavelength that exerts a quantum efficiency of 10% on a longer wavelength side is about 1080 nm, with the wavelength that exerts a quantum efficiency of 5% being set to 1130 nm. The microcrystalline germanium photoelectric conversion layer is formed by using an ECR remote plasma-enhanced CVD method that uses a microwave discharge.

PRIOR ART DOCUMENTS

Non-Patent Documents

Non-Patent Document 1: Xuejun Niu, Jeremy Booher and Vikran L. Dalal, "Nanocrystalline Germanium and Germanium Carbide Films and Devices", Materials Research Society Symposium Proceedings, Vol. 862, A10.2, (2005).

SUMMARY OF THE INVENTION

Problems to be Solved by the Invention

A goal of the invention is to improve a photoelectric conversion unit of a photoelectric conversion device having a crystalline germanium photoelectric conversion layer, by improving an open-circuit voltage, fill factor, and photoelectric conversion efficiency for a longer wavelength light.

In a thin-film photoelectric conversion device in which an amorphous silicon germanium (a-SiGe) photoelectric conversion unit or a crystalline silicon photoelectric conversion unit is used as a bottom cell for a stacked-type thin-film photoelectric conversion device of double- or triple-junction, the upper limit of a wavelength to be utilized on a longer wavelength side is 900 to 1100 nm, with the result that light with longer wavelengths is insufficiently utilized such that improvements to the conversion efficiency are insufficient.

Further, Non-Patent Document 1 discloses a thin-film photoelectric conversion device in which gradient composition layers of microcrystalline silicon germanium are used between a p-type semiconductor layer and a weak n-type microcrystalline germanium photoelectric conversion layer, and between an n-type semiconductor layer and a weak n-type microcrystalline germanium photoelectric conversion layer, respectively in a microcrystalline germanium photoelectric conversion unit. A thin-film photoelectric conversion device having a configuration as shown in Non-Patent Document 1 has a low open-circuit voltage and a low fill factor (FF), thereby raising a problem of low conversion efficiency. Also, there is a problem in that sufficient improvement in conversion efficiency cannot be obtained because the upper limit of the wavelength of the longer-wavelength light having a quantum efficiency of 10% or more is about 1080 nm.

Furthermore, as a result of studies made by the present inventors, it has been found out that generation of leakage current in the crystalline germanium photoelectric conversion layer is one of the factors causing a decrease in performance of the thin-film photoelectric conversion device.

In view of the above, an object of the present invention is to provide a thin-film photoelectric conversion device having a high open-circuit voltage and a high fill factor and having high characteristics capable of utilizing the longer wavelength light of 1000 nm or more.

Means for Solving the Problems

The invention relates to a thin-film photoelectric conversion device having a first electrode layer, one or more photoelectric conversion unit(s) and a second electrode layer, that are sequentially arranged on a substrate. Each photoelectric conversion unit has a photoelectric conversion layer sandwiched between a p-type semiconductor layer and an n-type semiconductor layer. At least one photoelectric conversion unit is a crystalline germanium photoelectric conversion unit including a crystalline germanium photoelectric conversion layer that is a substantially intrinsic or a weak n-type layer and consists of a crystalline germanium semiconductor layer essentially free of silicon atoms. A first interface layer, which is a substantially intrinsic amorphous silicon semiconductor layer, is arranged between the p-type semiconductor layer and the crystalline germanium photoelectric conversion layer of the crystalline photoelectric conversion unit. The first interface layer preferably has a thickness in the range of 1 nm or more and 20 nm or less.

The photoelectric conversion device is characterized in that the crystalline germanium photoelectric conversion layer is essentially free of silicon atoms. Herein, the condition of "essentially free of silicon atoms" refers to a condition indicating 1% or less of silicon atom content, which is almost a measurement limit, when measured by using any of X-ray photoelectron spectroscopy (XPS), energy dispersion X-ray spectroscopy (EDX), and Auger electron spectroscopy. When the crystalline germanium photoelectric conversion layer is essentially free of silicon atoms, the crystallinity is unexpectedly improved as compared with silicon germanium, thereby improving the absorption coefficient of light at longer wavelengths.

By disposing the first interface layer, which is a substantially intrinsic amorphous silicon semiconductor layer, between the p-type semiconductor layer and the crystalline germanium photoelectric conversion layer, a leakage current generated in the crystalline germanium photoelectric conversion layer can be reduced, and the rectification property of the thin-film photoelectric conversion device can be improved, thereby improving the open-circuit voltage and the fill factor.

From the viewpoint of improving the rectification property of the thin-film photoelectric conversion device, the effect thereof will be larger as the thickness of the first interface layer becomes larger. On the other hand, as the thickness of the first interface layer becomes larger, the short circuit current decreases, and the characteristics of the thin-film photoelectric conversion device are lowered.

This seems to be due to the following reason. When the thickness of the first interface layer increases, the light absorption at the first interface layer increases, and the amount of light incident into the crystalline germanium photoelectric conversion layer decreases and, moreover, the first interface layer inhibits the positive holes generated in the crystalline germanium photoelectric conversion layer from moving to the p-type semiconductor layer.

For this reason, the thickness of the first interface layer is required to be made large enough such that the effect of reducing the leakage current generated in the crystalline germanium photoelectric conversion layer is achieved, yet small enough such that the movement of the positive holes generated in the crystalline germanium photoelectric conversion layer is not inhibited. Accordingly, the thickness is preferably set to 1 nm or more and 20 nm or less. This can improve the short circuit current of the thin-film photoelectric conversion device, and efficient photoelectric conversion at the longer wavelength light of 1000 nm or more can be accomplished.

In addition, the first interface layer preferably has a hydrogen concentration of $7 \times 10^{21}$ (atom/cm$^3$) or more and $1.5 \times 10^{22}$ (atoms/cm$^3$) or less when detected by the secondary ion mass spectrometry. The hydrogen in the first interface layer has a function of terminating the unbonded electrons (dangling bonds) that may be present in the first interface layer, and may perturb the optical forbidden band of the first interface layer.

In a preferable thin-film photoelectric conversion device according to the present invention, the first interface layer has a hydrogen concentration of $7 \times 10^{21}$ (atoms/cm$^3$) or more and $1.5 \times 10^{22}$ (atoms/cm$^3$) or less when detected by the secondary ion mass spectrometry. This can improve the short circuit current of the thin-film photoelectric conversion device, and efficient photoelectric conversion of the longer wavelength light of 1000 nm or more can be achieved.

The crystalline germanium photoelectric conversion unit preferably has a p-type semiconductor layer on a side close to the substrate when viewed from the crystalline germanium photoelectric conversion layer, and has an n-type semiconductor layer on a side far from the substrate when viewed from the crystalline germanium photoelectric conversion layer. Employing this configuration may facilitate an integration of cells in the photoelectric conversion device.

The crystalline germanium photoelectric conversion layer preferably has a thickness of 50 nm or more and 1000 nm or less. When the crystalline germanium photoelectric conversion layer has a thickness of 50 nm or more and 1000 nm or less, the short circuit current is improved and the light having a longer wavelength of 1000 nm or more can be subjected to efficient photoelectric conversion, even in the case where the crystalline germanium photoelectric conversion layer is used either in a single-junction thin-film photoelectric conversion device or in a multi-junction thin-film photoelectric conversion device. This is because the crystalline germanium photoelectric conversion layer has a high absorption coefficient. When the crystalline germanium photoelectric conversion layer has a thickness of 50 nm or less, the light absorption in the longer wavelength region is not sufficient, and the quantum efficiency at the wavelength of 1000 nm may fall below 10%. When the crystalline germanium photoelectric conversion layer has a thickness of 1000 nm or more, the short circuit current decreases, thereby tending to cause deterioration in performance of a solar cell. Further, when the thickness is 1000 nm or less, advantages of not only shortening the deposition time but also lowering the production costs are achieved.

It is also preferable that a second interface layer including a substantially intrinsic non-single-crystal silicon semiconductor layer is arranged between the n-type semiconductor layer and the crystalline germanium photoelectric conversion layer. According to the configuration, the defect density at the interface can be reduced, decreasing the loss by recombination of electrons and positive holes at the interface, and thereby improving the characteristics of the thin-film photoelectric conversion device.

It is preferable that the second interface layer is a layer in which a substantially intrinsic amorphous silicon semiconductor layer and a substantially intrinsic crystalline silicon layer are arranged in this order from a side close to the n-type semiconductor layer. According to the configuration, the defect density at the interface can be reduced, and the effect of decreasing the loss, which may be caused by recombination of electrons and positive holes at the interface, will be more evident.

The p-type semiconductor layer of the photoelectric conversion unit including the crystalline germanium photoelectric conversion layer is preferably one or more selected from the group consisting of crystalline silicon, amorphous silicon, crystalline silicon germanium, amorphous silicon germanium, crystalline germanium, and amorphous germanium. According to the configuration, the positive holes generated in the crystalline germanium photoelectric conversion layer can move to the p-type semiconductor layer smoothly. It is particularly preferable that the p-type semiconductor layer is made of crystalline silicon, whereby the positive holes generated in the crystalline germanium photoelectric conversion layer can move to the p-type semiconductor more smoothly.

The n-type semiconductor layer of the photoelectric conversion unit including the crystalline germanium photoelectric conversion layer is preferably one or more selected from the group consisting of crystalline silicon, amorphous silicon, crystalline silicon germanium, amorphous silicon germanium, crystalline germanium and amorphous germanium. According to the configuration, the electrons generated in the crystalline germanium photoelectric conversion layer can move to the n-type semiconductor layer smoothly. It is particularly preferable that the n-type semiconductor layer is made of amorphous silicon, whereby the electrons generated in the crystalline germanium photoelectric conversion layer can move to the n-type semiconductor more smoothly.

One embodiment of the present invention is a triple-junction photoelectric conversion device having a configuration in which, between the transparent electrode layer and the crystalline germanium photoelectric conversion unit, an amorphous silicon photoelectric conversion unit and a crystalline silicon photoelectric conversion unit are arranged in this order from a light incident side. This triple-junction photoelectric conversion device is capable of utilizing solar light efficiently in wide range, and thus is preferable.

In addition, the present invention relates to a method for producing the thin-film photoelectric conversion device. The production method of the present invention includes a step of forming the crystalline germanium photoelectric conversion layer by a plasma-enhanced CVD method with a substrate temperature of 120° C. or higher and 250° C. or lower.

When the substrate temperature in forming the crystalline germanium photoelectric conversion layer is 250° C. or lower, diffusion of conductivity-type-determining impurities in the p-type semiconductor layer and the conformational change in the first interface layer can be reduced, thereby leading to an improvement in the open-circuit voltage, the short circuit current, and the fill factor. In addition, when the substrate temperature in forming the crystalline germanium photoelectric conversion layer is 250° C. or lower, degradation by heating of the photoelectric conversion unit deposited before formation of the crystalline germanium photoelectric conversion layer can be avoided. Therefore, in the case where the photoelectric conversion device has a configuration in which a plurality of photoelectric conversion units are stacked, the substrate temperature in forming the crystalline germanium photoelectric conversion layer is preferably set to 250° C. or lower.

When the substrate temperature in forming the crystalline germanium photoelectric conversion layer is 120° C. or higher, a crystalline germanium photoelectric conversion layer having few defects and having a high film density can be formed, thereby leading to a reduction in the leakage current and an improvement in the short circuit current. When the substrate temperature in forming the crystalline germanium photoelectric conversion layer is lower than 120° C., the film will have a high defect density in the crystalline germanium photoelectric conversion layer and will have a low film density. Moreover, the crystallinity of the crystalline germanium photoelectric conversion layer will decrease, whereby the light absorption in the longer wavelength region of 1000 nm or more will not be sufficient, and the short circuit current tends to decrease.

Further, in forming the crystalline germanium photoelectric conversion layer, it is preferable that a gas is supplied to a deposition chamber through a shower plate which is a plate perforated with numerous open holes, and the flow velocity of the gas at the time when the gas passes through the shower plate is set to 0.1 m/s or more and 10 m/s or less.

By setting the flow velocity of the deposition gas at the time when the gas passes through the shower plate to 0.1 m/s or more and 10 m/s or less, the reactive active species generated by decomposition of the reaction gas in the plasma reach the substrate efficiently, whereby the film can be formed without unevenness. When the flow velocity of the gas at the time when the gas passes through the shower plate is less than 0.1 m/s, supply of the gas will be insufficient, and the thickness at a part distant from the holes of the shower plate will be small, such that the uniformity of the film tends to be reduced. When the flow velocity of the gas at the time when the gas passes through the shower plate is larger than 10 m/s, the gas is sprayed onto the substrate before decomposition of the gas by plasma proceeds, whereby a portion of discoloration may be generated on the substrate that faces the holes of the shower plate, decreasing the performance of the solar cell.

It is preferable, in manufacturing of the triple-junction thin-film photoelectric conversion device, that the amorphous silicon photoelectric conversion unit, crystalline silicon conversion unit and the crystalline germanium photoelectric conversion unit are disposed in this order.

Effects of the Invention

In the invention, a first interface layer, which is a substantially intrinsic amorphous silicon semiconductor layer, is arranged between a p-type semiconductor layer and a crystalline germanium photoelectric conversion layer, whereby a leakage current may be reduced and thus an open-circuit voltage or a fill factor of a thin-film photoelectric conversion device may be improved.

Further, by setting the thickness of the first interface layer to 1 nm or more and 20 nm or less in the present invention, the movement of the positive holes generated in the crystalline germanium photoelectric conversion layer to the p-type semiconductor will be smooth, whereby the short circuit current and the quantum efficiency in the longer wavelength light of 1000 nm or more, and also the fill factor can be improved.

DESCRIPTION OF EMBODIMENTS

Figure 1:
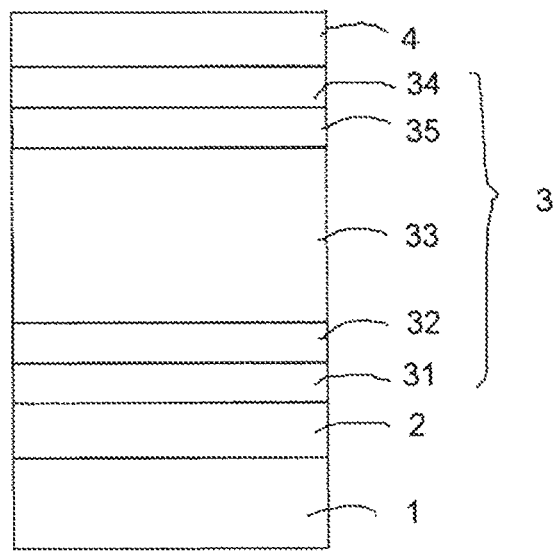
FIG. 1 is a schematic cross-sectional view that shows a single-junction thin-film photoelectric conversion device in accordance with one embodiment of the invention.

First, description is made to conventional arts relevant to the invention. In recent years, public attention has been focused on a photoelectric conversion device that converts light to electricity by utilizing a photoelectric effect inside a semiconductor, and development of the device has been vigorously carried out. Among these developments, a silicon-based thin-film photoelectric conversion device has been promising as a device that can achieve low costs, because it can be formed on a glass substrate or a stainless steel substrate with a large area, at low temperatures.

This silicon-based thin-film photoelectric conversion device generally has a structure in which a transparent electrode layer, one or more photoelectric conversion units and a back electrode layer are successively stacked on a transparent insulating substrate. In general, the photoelectric conversion unit has a p-type semiconductor layer, an i-type layer, and an n-type semiconductor layer that are stacked in this order or in an order reverse to this. When the i-type photoelectric conversion layer, which occupies its main portion, is made of an amorphous material, the unit is referred to as an amorphous photoelectric conversion unit, and when the i-type layer is made of a crystalline material, the unit is referred to as a crystalline photoelectric conversion unit.

The photoelectric conversion layer is a layer that absorbs light and then generates an electron and positive hole pair. In general, in such a silicon-based thin-film photoelectric conversion device of a pin junction, the i-type layer serves as a photoelectric conversion layer. The i-type layer serving as the photoelectric conversion layer occupies a main portion of the thickness of the photoelectric conversion unit.

Ideally, the i-type layer is an intrinsic semiconductor layer containing no conductivity-type-determining impurities. However, even when a layer contains a trace amount of impurities, it functions as an i-type layer of the pin junction when its Fermi level is located substantially in the center of a forbidden band; therefore, this is referred to as a "substantially i-type layer". In general, the substantially i-type layer is formed without adding a conductivity-type-determining impurity to a raw material gas. In this case, the conductivity-type-determining impurity may be contained therein within a permissible range that allows the layer to function as the i-type layer. Further, the substantially i-type layer may be formed by intentionally adding a trace amount of conductivity-type-determining impurity so as to remove influences given to the Fermi level by impurities arising from the atmospheric air and underlying layer. Herein, an impurity that converts an i-type layer into an n-type layer is called n-type impurity, an i-type layer that contains n-type impurity within an acceptable range where the layer maintains the function of i-type layer.

As a method for improving the conversion efficiency of the photoelectric conversion device, a photoelectric conversion device having a structure referred to as a stacked-type, in which two or more photoelectric conversion units are stacked, has been known. In this method, a front photoelectric conversion unit containing a photoelectric conversion layer having a large optical forbidden bandwidth is placed on a light incident side of a photoelectric conversion device, and behind this, a rear photoelectric conversion unit containing a photoelectric conversion layer (for example, made of a silicon-germanium alloy or the like) having a small optical forbidden bandwidth is successively placed so that a photoelectric converting process covering a wide wavelength range of incident light can be obtained; thus, by effectively utilizing incident light, the conversion efficiency for a conversion device as a whole can be improved.

For example, in a double-junction thin-film photoelectric conversion device in which an amorphous silicon photoelectric conversion unit and a crystalline silicon photoelectric conversion unit are stacked, wavelengths of light that can be photoelectrically converted by the i-type amorphous silicon are limited to about 700 nm on a longer wavelength side; the i-type crystalline silicon, on the other hand, can photoelectrically convert light with wavelengths longer than those, that is, up to about 1100 nm. Here, an amorphous silicon photoelectric conversion layer made from amorphous silicon has a relatively greater light absorption coefficient, and thus a thickness of about 0.3 μm is enough to absorb light that is sufficient for photoelectric conversion. On the other hand, the crystalline silicon photoelectric conversion layer made from crystalline silicon has a relatively smaller light absorption coefficient in comparison with that of amorphous silicon, and thus its thickness is preferably set to about 2 to 3 or more so as to sufficiently absorb light having longer wavelengths as well. That is, the crystalline silicon photoelectric conversion layer normally needs to have a thickness that is about 10 times larger than that of the amorphous silicon photoelectric conversion layer. Additionally, in the case of this double-junction thin-film photoelectric conversion device, the photoelectric conversion unit placed on the light incident side is referred to as a top cell, and the photoelectric conversion unit placed on the rear side is referred to as a bottom cell.

In addition, a triple-junction thin-film photoelectric conversion device having three photoelectric conversion units may also be used. In the present specification, the photoelectric conversion units of the triple-junction thin-film photoelectric conversion device are referred to as a top cell, a middle cell and a bottom cell, in succession from the light incident side. By using the triple-junction stacked-type thin-film photoelectric conversion device, the open circuit voltage (Voc) can be made higher, with the short circuit current density (Jsc) being set lower, so that in comparison with the double-junction, the thickness of an amorphous silicon photoelectric conversion layer of the top cell can be made thinner. For this reason, it is possible to suppress photodegradation of the top cell. In addition, by making the band gap of the photoelectric conversion layer of the middle cell narrower than that of the top cell, and also wider than that of the bottom cell, incident light can be utilized more effectively.

As an example of the triple-junction stacked-type thin-film photoelectric conversion device, a thin-film photoelectric conversion device in which amorphous silicon germanium is used for the photoelectric conversion layer of the middle cell, with an amorphous silicon photoelectric conversion unit/an amorphous silicon germanium photoelectric conversion unit/ an amorphous silicon germanium photoelectric conversion unit being stacked in this order, or a thin-film photoelectric conversion device, with an amorphous silicon photoelectric conversion unit/an amorphous silicon germanium photoelectric conversion unit/a crystalline silicon photoelectric conversion unit being stacked in this order, may be proposed. By appropriately adjusting the germanium concentration of the a-silicon germanium film, the optical band gap of amorphous silicon germanium of the photoelectric conversion layer of the middle cell can be controlled to a value between those of the top cell and the bottom cell. In the case where the amorphous silicon germanium photoelectric conversion layers are used for both the middle cell and the bottom cell, the germanium concentration of the bottom cell is preferably made higher than that of the middle cell.

However, it has been confirmed that in comparison with amorphous silicon, the amorphous silicon germanium layer, which is an alloy layer, has a higher defect density with its semiconductor characteristics being deteriorated, and also has an increase in defect density due to irradiation with light. For this reason, the triple-junction stacked-type thin-film photoelectric conversion device in which amorphous silicon germanium is used for the photoelectric conversion layer of the middle cell or the bottom cell is insufficient in improving the efficiency, in comparison with the double-junction thin-film photoelectric conversion device. Moreover, since the photodegradation of amorphous silicon germanium is serious, a problem arises that, although the triple-junction stacked-type thin-film photoelectric conversion device is used, it is not possible to sufficiently suppress the photodegradation.

In the case where the amorphous silicon germanium photoelectric conversion unit is used as the bottom cell, the wavelength of light that can be photoelectrically converted is limited to about 900 nm in a longer wavelength side, and in the case where the amorphous silicon photoelectric conversion unit is used as the bottom cell, the wavelength of light that can be photoelectrically converted is limited to about 1100 nm in the longer wavelength side. Therefore, the wavelength to be utilized on the longer wavelength side is the same as the wavelength of a double-junction thin-film photoelectric conversion device, which fails to provide improvements, resulting in a problem that the improvement of the conversion efficiency of the triple-junction thin-film photoelectric conversion device is insufficient.

In order to improve the conversion efficiency of a thin-film photoelectric conversion device, the present inventors have made studies on a configuration of a thin-film photoelectric conversion device including a crystalline germanium photoelectric conversion layer in order to perform efficient photoelectric conversion of light having a longer wavelength exceeding 1000 nm that has not been sufficiently utilized in a conventional silicon-based thin-film photoelectric conversion device in addition to an improvement in the open-circuit voltage and the fill factor of a crystalline germanium photoelectric conversion unit. As a result, it has been found that efficient photoelectric conversion of longer wavelength light exceeding 1000 nm can be achieved, in addition to improvements in the open-circuit voltage and the fill factor, by disposing a first interface layer, which is a substantially intrinsic amorphous silicon semiconductor layer, between a p-type semiconductor layer and the crystalline germanium photoelectric conversion layer.

Non-Patent Document 1 discloses a thin-film photoelectric conversion device in which a weak n-type microcrystalline germanium photoelectric conversion layer is formed at a substrate temperature of 250° C. and a gradient composition layer of microcrystalline silicon germanium is disposed at the p/i-interface and at the n/i-interface. However, as described above, this thin-film photoelectric conversion device has a low photoelectric conversion efficiency at longer wavelengths of light. This seems to be because the defect density increases as the germanium composition of the gradient composition layer of microcrystalline silicon germanium increases.

Referring to the drawings, preferred embodiments of the present invention, made in view of the aforementioned circumstances, will be described below. In the drawings of this application, dimensional relationships, such as thickness and length, are properly altered as needed for clarity and simplicity of the drawings, and do not correspond to actual dimensions. In addition, in the respective drawings, the same reference numerals represent the same members or the corresponding portions. In the present specification, the terms "crystalline" and "microcrystalline" are applied to a state in which an amorphous structure is partially included, as has been used in the relevant technical field.

FIG. 1 is a schematic cross-sectional view that shows a single-junction thin-film photoelectric conversion device in accordance with one embodiment of the invention. A transparent electrode layer 2, a crystalline germanium photoelectric conversion unit 3 and a back electrode layer 4 are arranged in this order on a transparent substrate 1. In the present invention, the crystalline germanium photoelectric conversion unit 3 is a photoelectric conversion unit using a crystalline germanium photoelectric conversion layer 33 including substantially intrinsic or a weak n-type crystalline germanium semiconductor.

A plate-shaped member or a sheet-shaped member made of glass, a transparent resin or the like is used as the transparent substrate 1 in a photoelectric conversion device of a type in which light is made incident from the substrate side. In particular, it is preferable to use a glass plate as the transparent substrate 1 for achieving high transmittance at low cost.

That is, since the transparent substrate 1 is arranged at the light incident side of the thin-film photoelectric conversion device, it is preferably made as transparent as possible so as to transmit as much solar light as possible for absorption in the photoelectric conversion unit. For the same purpose, an anti-reflection coating is preferably formed on the light incident surface of the transparent substrate 1 so as to reduce light reflection loss on the incident surface of solar light.

The transparent electrode layer 2 forms the first electrode layer used in a photoelectric conversion device in which light is incident from the substrate side. In particular, the transparent electrode layer 2 is desirably as transparent as possible in order to allow solar light to be transmitted for absorption into the photoelectric conversion unit, and is desirably electrically conductive in order to transport the positive holes generated in the photoelectric conversion unit without loss.

Therefore, the transparent electrode layer 2 is preferably made from a conductive metal oxide such as tin oxide ($SnO_2$) or zinc oxide (ZnO), and preferably formed by using a method such as a chemical vapor deposition (CVD) method, a sputtering method or a vapor deposition method. The transparent electrode layer 2 is preferably provided with a fine irregular structure on its surface so as to increase scattering of the incident light.

The crystalline germanium photoelectric conversion unit 3 is formed, for example, by disposing a p-type semiconductor layer 31, a first interface layer 32 which is a substantially intrinsic amorphous silicon semiconductor layer, a crystalline germanium photoelectric conversion layer 33, a second interface layer 35 and an n-type semiconductor layer 34 in this order by a plasma enhanced CVD method.

The p-type semiconductor layer 31 may be made of one or more of crystalline silicon, amorphous silicon, crystalline silicon germanium, amorphous silicon germanium, crystalline germanium, and amorphous germanium doped with a p-type impurity. The p-type semiconductor layer 31 can be formed by using the same deposition apparatus as that used in forming the crystalline germanium photoelectric conversion layer 33. In particular, as the p-type semiconductor layer 31, it is preferable to use microcrystalline silicon doped with 0.01 atom % or more of boron. When the p-type semiconductor layer 31 is made of microcrystalline silicon, movement of the positive holes from the crystalline germanium photoelectric conversion layer 33 to the p-type semiconductor layer 31 will be smooth, so that it is more preferable.

Crystalline germanium has an optical forbidden bandwidth of 0.65 eV, which is narrower as compared with 1.8 eV of amorphous silicon and 1.1 eV of crystalline silicon. Therefore, in the case of using crystalline germanium in a photoelectric conversion layer, a leakage current via the defect level or the impurity level within the optical forbidden band is liable to be generated. With regard to the solar cell performance, this leakage current seems to cause a considerable decrease in the fill factor and the open-circuit voltage.

In order to reduce the leakage current generated in the crystalline germanium photoelectric conversion layer 33, the first interface layer 32, which is a substantially intrinsic amorphous silicon semiconductor layer, which is disposed between the p-type semiconductor layer 31 and the crystalline germanium photoelectric conversion layer 33, preferably covers the whole surface of the p-type semiconductor layer 31.

With regard to the first interface layer 32, which is a substantially intrinsic amorphous silicon semiconductor layer, and the crystalline germanium photoelectric conversion layer 33, the optical forbidden bandwidths of the two layers are different by 1 eV or more, so that an energy barrier arising from the mismatch of their optical forbidden bandwidths is formed at the junction interface. Moreover, since the optical forbidden bandwidth of the substantially intrinsic amorphous silicon semiconductor layer is wide, positive hole movement generated by light absorption in the germanium photoelectric conversion layer 33 may be inhibited by the first interface layer 32 to lower the characteristics of the thin-film photoelectric conversion device. For this reason, it is inferred that general persons skilled in the art would hardly conceive that the disposition of an amorphous silicon semiconductor layer at the p-layer side interface of the crystalline germanium photoelectric conversion layer 33 is a preferable combination.

However, as a result of eager studies made by the present inventors, it has been unexpectedly found that, when the first interface layer 32, which is a substantially intrinsic amorphous silicon semiconductor layer, is disposed between the p-type semiconductor layer 31 and the crystalline germanium photoelectric conversion layer 33, the leakage current is restrained, thereby improving the fill factor, and also the power-generating current of longer wavelength. It is inferred that this is due to the following reason. Because the first interface layer 32, which is a substantially intrinsic amorphous silicon semiconductor layer, is present, the defects caused by lattice mismatch between the p-type semiconductor layer 31 (for example, microcrystalline silicon) and the crystalline germanium photoelectric conversion layer 33 are restrained, whereby the defect density at the interface is reduced to restrain the leakage current. Alternatively, it is inferred that, because the first interface layer 32, which is a substantially intrinsic amorphous silicon semiconductor layer, is present, insular growth of crystalline germanium at the initial growth stage is restrained to reduce the leakage current.

In particular, it is preferable to set the thickness of the first interface layer 32, which is a substantially intrinsic amorphous silicon semiconductor layer, to 20 nm or less. By setting the thickness of the first interface layer 32 to 20 nm or less, the leakage current that flows through the crystalline germanium photoelectric conversion layer 33 can be suppressed. It is inferred that this is because the influence of the discontinuity in the band gap is alleviated, and positive hole movement generated by a light absorption in the germanium photoelectric conversion layer is successfully realized. When the thickness of the first interface layer 32 becomes larger than 20 nm, the characteristics of the thin-film photoelectric conversion device begin to be deteriorated. It is inferred that this is because the influence of the discontinuity in the band gap becomes significant, and positive hole movement generated by a light absorption in the germanium photoelectric conversion layer 33 is inhibited.

In addition, it is preferable to set the thickness of the first interface layer 32, which is a substantially intrinsic amorphous silicon semiconductor layer, to 1 nm or more. By setting the thickness of the first interface layer 32 to 1 nm or more, the leakage current of the thin-film photoelectric conversion device is restrained. It seems that this is because the defects caused by lattice mismatch between the p-type semiconductor layer 31 (for example, microcrystalline silicon) and the crystalline germanium photoelectric conversion layer 33 are restrained to reduce the defect density at the interface, or alternatively, because the first interface layer 32 is present, an insular growth of crystalline germanium at the initial growth stage is restrained.

Therefore, the first interface layer 32, which is a substantially intrinsic amorphous silicon semiconductor layer, preferably has a thickness of 1 nm or more and 20 nm or less. Further, in order to set the quantum efficiency of the crystalline germanium photoelectric conversion unit at a wavelength of 1000 nm to a high value of 30% or more, it is desired that the first interface layer 32 has a thickness of 3 nm or more and 18 nm or less.

The thickness of the first interface layer 32 can be confirmed from a cross-sectional image obtained by observation with a transmission electron microscope. Further, from the cross-sectional image of a transmission electron microscope, it can be confirmed that the first interface layer is made of amorphous silicon that does not contain a crystalline phase. In particular, when a dark field image is observed by a transmission electron microscope, only the crystal phase is seen to be bright. Therefore, when it is confirmed that there are no bright points in the first interface layer, it can be determined that the first interface layer is amorphous. Alternatively, by observing a diffraction image from a transmission electron microscope, it can be determined whether or not the first interface layer is amorphous.

It is preferable that the first interface layer 32 has a hydrogen concentration of $7\times10^{21}$ (atoms/cm$^3$) or more and $1.5\times10^{22}$ (atoms/cm$^3$) or less when detected by secondary ion mass spectrometry (apparatus model number: IMF-4F). When the first interface layer 32 has a hydrogen concentration of $7\times10^{21}$ (atoms/cm$^3$) or more, the defect density caused by the unbonded electrons (dangling bond) in the first interface layer 32, which is a substantially intrinsic amorphous silicon semiconductor layer, is reduced, thereby improving the electric characteristics of the substantially intrinsic amorphous silicon semiconductor layer. Alternatively, when the first interface layer 32 of substantially intrinsic amorphous silicon semiconductor layer has a hydrogen concentration of $7\times10^{21}$ (atoms/cm$^3$) or more, the first interface layer is prevented from developing microcrystalline silicon, thereby restraining the leakage current. When the first interface layer 32 has a hydrogen concentration of less than $7\times10^{21}$ (atoms/cm$^3$), a crystalline silicon phase is generated in a part of the first interface layer 32, and the first interface layer 32 is liable to become a microcrystalline silicon layer, whereby the leakage current may suddenly increase in some cases. It seems that this is because when the first interface layer is a microcrystalline silicon layer, lattice mismatch is generated at the interface to the crystalline germanium photoelectric conversion unit, which increases the defects at the interface.

In addition, by setting the hydrogen concentration of the first interface layer 32, which is a substantially intrinsic amorphous silicon semiconductor layer, to $1.5\times10^{22}$ (atoms/cm$^3$) or less, the density of the Si—H$_2$ bond in the amorphous silicon layer is reduced, so that the electric characteristics of the first interface layer 32, which is a substantially intrinsic amorphous silicon semiconductor layer, are improved. When the amount of hydrogen in the amorphous silicon layer is larger, the Si—$H_2$ bond density increases as compared with the Si—H bond density. When the Si—$H_2$ bond density is high, the electric characteristics are deteriorated. Thus, hydrogen concentration of the first interface layer 32 is preferably set to $1.5 \times 10^{22}$ (atoms/cm$^3$) or less.

The crystalline germanium photoelectric conversion layer 33 is preferably an intrinsic-type or a weak n-type. In general, a gas containing a conductivity-type-determining impurity element is not used for forming a photoelectric conversion layer. Nevertheless, crystalline germanium sometimes exhibits weak n-type characteristics. This is presumably because crystalline germanium easily absorbs impurities arising from the air, such as oxygen, in the film. With regards to the index for the weak n-type semiconductor applicable to the crystalline germanium photoelectric conversion layer 33, the carrier concentration of crystalline germanium found by the Hall-effect measurement is preferably set to $10^{17}$ cm$^{-3}$ or less, and the mobility is preferably set to 1 cm$^2$/(V·s) or more. When the carrier concentration is too high, a dark current in the photoelectric conversion device increases, tending to cause an increase in leakage current and a subsequent reduction in FF of the photoelectric conversion device.

The crystalline germanium photoelectric conversion layer 33 is desirably formed by using a high-frequency plasma enhanced CVD method, with GeH$_4$ and H$_2$ being used as reaction gases, for example. In this case, the H$_2$/GeH$_4$ ratio is preferably set in a range from 200 to 5000. When the H$_2$/GeH$_4$ ratio is smaller than 200, the crystal volume fraction is deteriorated to undesirably cause an amorphous state; in contrast, when the H$_2$/GeH$_4$ ratio is greater than 5000, the film-deposition rate is lowered to cause a reduction in productivity. In order to obtain good crystallinity and an industrially permissible film-deposition rate, the H$_2$/GeH$_4$ ratio is desirably set in a range from 500 to 2000.

The flow velocity of a deposition gas in forming the crystalline germanium photoelectric conversion layer 33 is desirably 0.1 m/s or more and 10 m/s or less at the time when the gas passes through a shower plate. When the flow velocity of the deposition gas is 0.1 m/s or less, the reaction gas is decomposed in such a manner that even the active species having high reactivity in the plasma is decomposed, so that the film density on the substrate tends to be coarse. When the flow velocity of the deposition gas is 10 m/s or more, the ratio of the reaction gas decomposed in the plasma will be small, whereby unevenness may be generated in depositing the film onto the substrate. Here, the flow velocity refers to a flow velocity under the pressure at the time of forming the film. The flow velocity can be determined by dividing the volume flow rate under the pressure in the deposition chamber by the sum of the areas of the holes of the shower plate.

In order to form a crystalline germanium photoelectric conversion layer 33 uniformly in a large area by using a plasma enhanced CVD method, it is preferable to use a frequency of 10 to 100 MHz, with a capacitive coupling type parallel-plane electrode being adopted, rather than using a microwave frequency such as 2.45 GHz. In particular, it is preferable to use 13.56 MHz, 27.12 MHz and 40 MHz, which has been industrially practiced. In order to accelerate the crystallization, the high-frequency power density is desirably set to 200 mW/cm$^2$ or more and more desirably set to 550 mW/cm$^2$ or more.

In forming a crystalline germanium photoelectric conversion layer 33, the substrate temperature is preferably set to 120° C. or more, and more desirably set to 150° C. or more in order to suppress generation of powder during the forming process. In order to suppress diffusion of impurities from the conductivity-type layer into the photoelectric conversion layer, the substrate temperature is preferably set to 250° C. or less, more preferably to 230° C. or less.

Further, in forming a crystalline germanium photoelectric conversion layer 33, the pressure is desirably set to 40 Pa or more and 200 Pa or less in order to provide good crystallinity. Furthermore, in order to improve the uniformity upon forming a layer with a large area, the pressure is desirably set to 200 Pa or more and 1500 Pa or less. In order to satisfy both good crystallinity and a high film-deposition rate, the pressure is preferably set to 500 Pa or more and 1330 Pa or less.

It is preferable that the crystalline germanium photoelectric conversion layer 33 is essentially free of silicon atoms. Here, the condition of "essentially free of silicon atoms" refers to a condition of indicating 1% or less of silicon atom content, which is almost a measurement limit, when measured by using any of X-ray photoelectron spectroscopy (XPS), energy dispersion X-ray spectroscopy (EDX), and Auger electron spectroscopy. When the crystalline germanium photoelectric conversion layer 33 does not contain silicon atoms, the crystallinity is unexpectedly improved as compared with silicon germanium, whereby the absorption coefficient of the longer wavelength can be improved.

It is important to set an absorption coefficient of the infrared-absorption peak at the wave number of 935±5 cm$^{-1}$ of the crystalline germanium photoelectric conversion layer 33 to a range from 0 cm$^{-1}$ or more and less than 6000 cm$^{-1}$, preferably, from 0 cm$^{-1}$ or more and less than 5000 cm$^{-1}$, more preferably, from 10 cm$^{-1}$ or more and less than 2500 cm$^{-1}$. Although the origin of an infrared-absorption peak at the wave number of 935±5 cm$^{-1}$ has not been identified, it is considered to arise from germanium hydride or germanium oxide in a polymer or cluster state. By suppressing this infrared-absorption peak to a low level, dense crystalline germanium can be formed so that the characteristics of the thin-film photoelectric conversion device can be improved. An absorption coefficient of an infrared-absorption peak at a wave number of 960±5 cm$^{-1}$ is preferably set to 0 cm$^{-1}$ or more and less than 3500 cm$^{-1}$, more preferably to 0 cm$^{-1}$ or more and less than 3000 cm$^{-1}$, and further more preferably to 10 cm$^{-1}$ or more and less than 1300 cm$^{-1}$. Although the origin of an infrared-absorption peak at the wave number of 960±5 cm$^{-1}$ has also not been identified, it is considered to arise from germanium hydride or germanium oxide in a polymer or cluster state as described above. It is presumed that, by suppressing this infrared-absorption peak to a low level, dense crystalline germanium can be formed so that the characteristics of the thin-film photoelectric conversion device are improved.

The infrared-absorption spectrum of the infrared ray can be measured by FTIR (Fourier Transform Infrared Spectroscopy). For example, the infrared-absorption spectrum can be measured by using the following sequence of processes. (1) A crystalline germanium film is formed on a crystal silicon substrate having a high resistance value of 1 Ω-cm or more under the same deposition conditions as those of the photoelectric conversion layer, and the infrared-ray transmission spectrum thereof is measured. (2) The transmittance of the sample is divided by the transmittance of the crystal silicon substrate without the film so that the transmission spectrum of only the crystalline germanium film is found. (3) Since the transmission spectrum obtained in the above-mentioned (2) includes influences of interference and offset, a base line is drawn by connecting areas having no absorption to each other, and the transmission spectrum is divided by the transmittance of the base line. (4) Lastly, an absorption coefficient, α, is found from the following formula.

$$\alpha = -\frac{1}{d}\ln\left\{\frac{-2T_S + \sqrt{4T_S^2 + (1-T_S)^2(1+T_S)^2\Delta T}}{(1-T_S)^2\Delta T}\right\}$$

In this formula, d represents a thickness, $T_s$ represents a transmittance of the crystal silicon substrate that is equal to 0.53, and $\Delta T$ represents a transmittance of the film found in the above-mentioned (3). Moreover, by using an ATR crystal, an infrared-absorption spectrum of each of the glass substrate, the transparent electrode layer and the crystalline germanium film formed on the metal electrode layer can be obtained. By preliminarily obtaining a transmission spectrum of the film on the crystal silicon substrate and a calibration curve of a spectrum obtained by using the ATR crystal, the absorption coefficient α can be obtained from the spectrum measured using the ATR crystal.

In the crystalline germanium photoelectric conversion layer 33, an intensity ratio between a (220) peak and a (111) peak measured by the X-ray diffraction is preferably set to 2 or more. By increasing a (220) orientation, crystalline germanium is allowed to form columnar crystals in a direction perpendicular to the substrate so that the crystal size in the thickness direction becomes greater, thereby allowing a photoelectric conversion electric current to easily flow, and improving characteristics of the thin-film photoelectric conversion device.

In the germanium photoelectric conversion layer 33, the refractive index relative to light having a wavelength of 600 nm is preferably set to 4.0 or more. The refractive index is more preferably set to 4.7 or more relative to light having a wavelength of 600 nm. By setting the refractive index relative to light having a wavelength of 600 nm to 4.0 or more, a dense crystalline germanium can be formed so that longer wavelength light rays exceeding 1000 nm can be utilized.

A thickness of the crystalline germanium photoelectric conversion layer is preferably set to 50 nm or more and 100 or less. The thickness of the crystalline germanium photoelectric conversion layer 33 can be confirmed from an image obtained by observation with a transmission electron microscope. Since the crystalline germanium photoelectric conversion layer 33 has a high absorption coefficient, the longer wavelength light of 900 nm or more can be efficiently subjected to photoelectric conversion to improve the short circuit current when the crystalline germanium photoelectric conversion layer 33 has a thickness of 50 nm or more and 1000 nm or less even in the case where the crystalline germanium photoelectric conversion layer 33 is used in a single-junction thin-film photoelectric conversion device or in a multi-junction thin-film photoelectric conversion device. Further, when the thickness is 1000 nm or less, it gives advantages of not only shortening the deposition time but also lowering the production costs.

Figure 3:
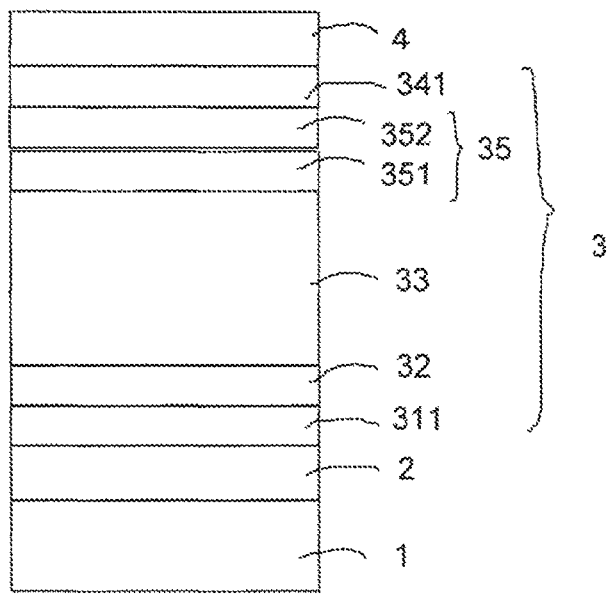
FIG. 3 is a schematic cross-sectional view that shows a single-junction thin-film photoelectric conversion device of Examples 1-4 and Comparative Example 2 of the invention.

In particular, crystalline silicon or amorphous silicon can be used as the second interface layer 35 made of a substantially intrinsic non-single-crystal silicon semiconductor layer that is disposed between the n-type semiconductor layer 34 and the crystalline germanium photoelectric conversion layer 33. Further, as shown in FIG. 3, the second interface layer 35 preferably has a structure in which a substantially intrinsic crystalline silicon layer and a substantially intrinsic amorphous silicon layer are stacked. In particular, the second interface layer 35 is preferably a layer in which a substantially intrinsic amorphous silicon layer 352 and a substantially intrinsic crystalline silicon layer 351 are stacked in this order from the side nearer to the n-type semiconductor layer 34.

This seems to be because the second interface layer has a function of reducing the defect density at the junction interface and restraining the electric current loss arising from the recombination of electrons and positive holes. The thickness of the substantially intrinsic crystalline silicon layer 351 in the second interface layer 35 is preferably within a range from 0.5 nm to 500 nm. In particular, the thickness is more preferably within a range from 1 nm to 100 nm. The thickness of the substantially intrinsic amorphous silicon layer 352 in the second interface layer 35 is preferably within a range from 0.1 nm to 100 nm. In particular, the thickness is more preferably within a range from 0.5 nm to 50 nm.

The n-type semiconductor layer 34 is preferably made of one or more of crystalline silicon, amorphous silicon, crystalline silicon germanium, amorphous silicon germanium, crystalline germanium and amorphous germanium. By using any of these layers, a junction with the crystalline germanium photoelectric conversion layer 33 can be suitably formed. The same deposition apparatus for forming the crystalline germanium photoelectric conversion layer 33 can be used. For example, microcrystalline silicon doped with phosphorus at 0.01 atom % or more can be used. With regards to the n-type semiconductor layer, an amorphous silicon layer 341 is preferable to a crystalline silicon layer. This seems to be due to the following reason. Since the optical forbidden bandwidth of the amorphous silicon layer is larger as compared to that of the crystalline silicon layer, diffusion of the positive holes from the crystalline germanium photoelectric conversion layer 33 to the n-type semiconductor layer is restrained, whereby the amorphous silicon layer 341 prevents the recombination of the positive holes in the n-type semiconductor layer.

An example of a back electrode layer 4 is a second electrode layer used in a photoelectric conversion device having a configuration in which light is incident from the substrate side. The back electrode layer 4 has a function of enhancing the efficiency of absorbing solar light in the photoelectric conversion layer by reflecting the solar light that has passed through the photoelectric conversion unit back to the photoelectric conversion unit side. For this reason, the back electrode layer 4 preferably has a high reflectivity to solar light. Further, in order to transport the electrons generated in the photoelectric conversion unit without loss, the back electrode layer 4 is preferably electrically conductive.

Therefore, the back electrode layer 4 is preferably formed from one or more metal layers made from at least one material selected from aluminum (Al), silver (Ag), gold (Au), copper (Cu), platinum (Pt) and chromium (Cr) using a sputtering method or a vapor deposition method. Moreover, a layer made from a conductive oxide such as ITO, $SnO_2$, or ZnO may be formed between the photoelectric conversion unit and the metal layer (not shown).

Figure 2:
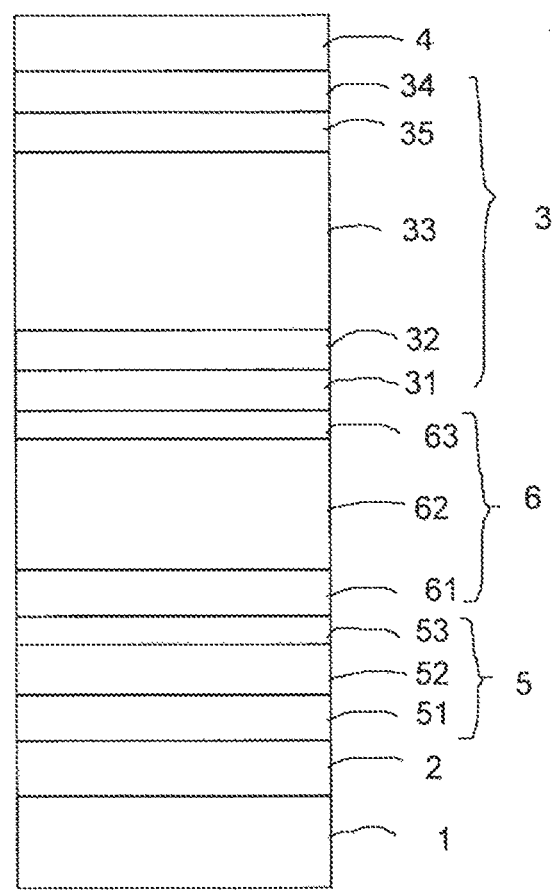
FIG. 2 is a schematic cross-sectional view that shows a triple-junction thin-film photoelectric conversion device in accordance with another embodiment of the invention.

FIG. 2 is a cross-sectional view that schematically shows a triple-junction thin-film photoelectric conversion device in accordance with another embodiment of the invention. This thin-film photoelectric conversion device has a structure in which an amorphous silicon photoelectric conversion unit 5 and a crystalline silicon photoelectric conversion unit 6 are successively formed between the transparent electrode layer 2 and the crystalline germanium photoelectric conversion unit 3 of the single-junction thin-film photoelectric conversion device shown in FIG. 1. That is, from the light-incident side, an amorphous silicon photoelectric conversion unit serving as a top cell, a crystalline silicon photoelectric conversion unit serving as a middle cell and a crystalline germanium photoelectric conversion unit serving as a bottom cell are successively formed. In this configuration, degradation by heating of the photoelectric conversion units that are deposited before the formation of the crystalline germanium photoelectric conversion layer can be prevented by setting the deposition temperature to 250° C. or lower in forming the crystalline germanium photoelectric conversion unit, which is a bottom cell. As a result, performance of the triple-junction thin-film photoelectric conversion device can be improved.

The substrate 1, the transparent electrode layer 2, the crystalline germanium photoelectric conversion unit 3 serving as the bottom cell, and the back electrode layer 4 can be formed by using the same compositions and the same methods as those in the embodiment of FIG. 1. Herein, it is preferable that a thickness of the crystalline germanium photoelectric conversion layer 33 is arbitrarily adjusted so that a spectral sensitivity current is roughly in accordance with that of the top cell 5 and the middle cell 6.

An amorphous silicon photoelectric conversion unit 5 serving as the top cell is formed, for example, by stacking a p-type semiconductor layer, an i-type layer and an n-type semiconductor layer in this order. More specifically, a p-type amorphous silicon carbide layer 51 doped with 0.01 atom % or more of boron, a substantially i-type amorphous silicon photoelectric conversion layer 52, and an n-type amorphous silicon layer 53 doped with 0.01 atom % or more of phosphorus are disposed in this order.

The crystalline silicon photoelectric conversion unit 6 serving as the middle cell is formed, for example, by stacking a p-type semiconductor layer, an i-type layer and an n-type semiconductor layer in this order. More specifically, a p-type microcrystalline silicon layer 61 doped with 0.01 atom % or more of boron, a substantially i-type crystalline silicon photoelectric conversion layer 62, and an n-type microcrystalline silicon layer 63 doped with 0.01 atom % or more of phosphorus are disposed in this order.

Here, in FIG. 2, a triple-junction thin-film photoelectric conversion device is shown; however, it will be understood that, by placing the crystalline germanium photoelectric conversion unit on the photoelectric conversion unit that is farthest from the light incident side, a thin-film photoelectric conversion device in which a double-junction photoelectric conversion unit or a four- or more-junction photoelectric conversion unit is stacked can be obtained.

Although FIG. 1 shows a thin-film photoelectric conversion device in which light is made incident from the substrate side, it will be understood that the invention is effectively applied also to a thin-film photoelectric conversion device in which light is made incident from the side opposite to the substrate. In the case where light is made incident thereon from the side opposite to the substrate, for example, an arrangement may be made so that a substrate, a back electrode layer, a crystalline germanium photoelectric conversion unit and a transparent electrode layer are stacked in this order. In this case, the crystalline germanium photoelectric conversion unit is preferably formed by depositing an n-type semiconductor layer, a crystalline germanium photoelectric conversion layer and a p-type semiconductor layer in this order. In a thin-film photoelectric conversion device in which light is made incident from the side opposite to the substrate, the first electrode layer is a back electrode and the second electrode layer is a transparent electrode layer.

It will be understood that the invention is effectively applied also to an integrated-type thin-film photoelectric conversion device in which a series-connected structure is formed on the same substrate by using a laser patterning process. In the case of the integrated-type thin-film photoelectric conversion device, the structure in which light is made incident from the substrate side as shown in FIG. 1 is preferably used because the laser patterning process is easily carried out thereon.

When the photoelectric conversion device is integrated, in accordance with the structure in which light is incident from the substrate side, it is preferable to dispose the p-type layer, the photoelectric conversion layer, and the n-type layer in this order. This is due to the following reason. Since the mobility of positive holes is shorter than that of electrons in a thin-film photoelectric conversion device, the conversion efficiency will be higher when the p-type layer is disposed on the light incident side.

EXAMPLES

In the following, the invention will be described in more detail based upon Examples of the invention and Comparative Examples of the prior art. In the respective drawings, similar members are indicated by the same reference numerals, and repeated explanations thereof will be omitted. Additionally, it will be understood that the invention is not limited to the following Examples, and various changes may be made within the scope not departing from the gist of the invention.

Example 1

A single-junction thin-film photoelectric conversion device 7 having a structure shown in FIG. 3 was manufactured as Example 1. As a transparent substrate 1, a glass substrate having a thickness of 1.8 mm was used. As a transparent electrode 2, which is a first electrode layer, an $SnO_2$ film having an average thickness of 700 nm, with fine pyramid-shaped surface irregularities contained therein was formed on the transparent substrate 1 by a thermal CVD method. Further, a ZnO film doped with Al was formed thereon with a thickness of 20 nm by using a sputtering method so that a transparent electrode layer 2 in which $SnO_2$ and ZnO were stacked was formed. The resulting transparent electrode layer 2 had a sheet resistivity of about 9 Ω/sq. The haze ratio measured by using an illuminant C was 14%, and an average level difference d of the surface irregularities was about 100 nm.

The haze ratio was measured based upon JIS K7136.

On this transparent electrode layer 2, a crystalline germanium photoelectric conversion unit 3 was formed by using a capacitive coupling type high-frequency plasma enhanced CVD device provided with a parallel-plate electrode with a frequency of 13.56 MHz. A p-type microcrystalline silicon layer 311 with a thickness of 10 nm was formed by introducing $SiH_4$, $H_2$ and $B_2H_6$ as reaction gases. Thereafter, a first interface layer 32, which is a substantially intrinsic amorphous silicon semiconductor layer, was formed to have a thickness of 10 nm. At this time, the flow ratio of $H_2/SiH_4$ was set to 10, the substrate temperature was set to 200° C., the pressure was set to 270 Pa, and the high-frequency power density was set to 20 mW/cm$^2$. The hydrogen concentration of the amorphous silicon layer as measured by secondary ion mass spectrometry (apparatus model number: IMF-4F) at this time was $9 \times 10^{21}$ (atoms/cm$^3$). Also, through observation of a cross-section of the thin-film photoelectric conversion device with a transmission electron microscope, the first interface layer 32 was determined to have a thickness of 10 nm and to be amorphous.

Subsequently, $GeH_4$ and $H_2$ were introduced to form a crystalline germanium photoelectric conversion layer 33 at a thickness of 500 nm. At this time, the flow ratio of $H_2/GeH_4$ was set to 2000, and the flow rates were adjusted so that the gas would pass through the holes of a shower plate at a velocity of 1.3 m/s. The substrate temperature was set to 200° C., the pressure was set to 930 Pa, and the high-frequency power density was set to 850 mW/cm$^2$. Next, as reaction gases, SiH$_4$ and H$_2$ were introduced to form a crystalline silicon layer 351, a part of second interface layer 35, at a thickness of 10 nm, and further to form an amorphous silicon layer 352 at a thickness of 10 nm. Subsequently, SiH$_4$, H$_2$, and PH$_3$ were introduced as reaction gases to form an n-type amorphous silicon layer 341 at a thickness of 10 nm, so as to form a crystalline germanium photoelectric conversion unit 3.

Thereafter, as a second electrode layer, a back electrode layer 4 was formed. To form the back electrode layer 4, an Al doped ZnO film having a thickness of 30 nm and an Ag film having a thickness of 300 nm were successively formed by a sputtering method.

After the formation of the back electrode layer 4, the films formed on the transparent electrode layer 1 were partially removed by a laser scribe method, and separated into a size of 1 cm$^2$, thereby manufacturing a single-junction thin-film photoelectric conversion device 7 (light-receiving area of 1 cm$^2$).

Example 2

In Example 2, a single-junction thin-film photoelectric conversion device 8 similar to that of Example 1, which is shown in FIG. 3, was manufactured. The device in Example 2 was manufactured in the same manner as in Example 1, except the first interface layer 32, which is a substantially intrinsic amorphous silicon semiconductor layer, was formed to have a thickness of 5 nm.

Example 3

In Example 3, a single-junction thin-film photoelectric conversion device 9 similar to that of Example 1, which is shown in FIG. 3, was manufactured. The device in Example 3 was manufactured in the same manner as in Example 1, except the first interface layer 32, which is a substantially intrinsic amorphous silicon semiconductor layer, was formed to have a thickness of 1 nm.

Example 4

In Example 4, a single-junction thin-film photoelectric conversion device 10 similar to that of Example 1, which is shown in FIG. 3, was manufactured. The device in Example 3 was manufactured in the same manner as in Example 1, except the first interface layer 32, which is a substantially intrinsic amorphous silicon semiconductor layer, was formed to have a thickness of 20 nm.

Comparative Example 1

Figure 4:
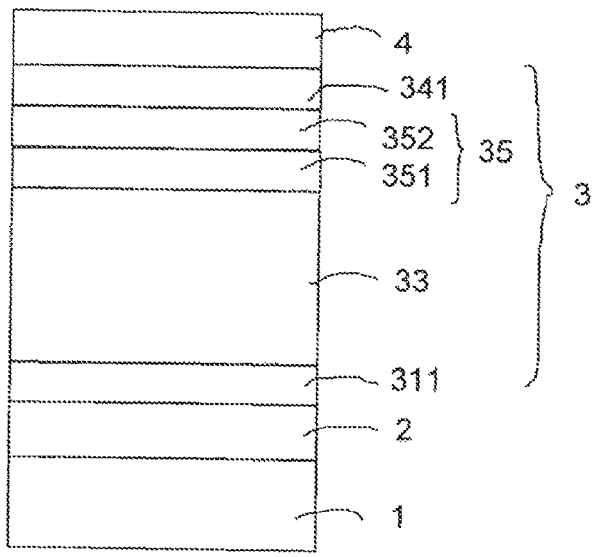
FIG. 4 is a schematic cross-sectional view that shows a single-junction thin-film photoelectric conversion device of Comparative Example 1 of the invention.

In Comparative Example 1, a single-junction thin-film photoelectric conversion device 11 similar to that of Example 1, which is shown in FIG. 4, was manufactured. The device in Comparative Example 1 was manufactured in the same manner as in Example 1, except the device had a configuration without having the first interface layer 32.

Comparative Example 2

In Comparative Example 2, a single junction thin-film photoelectric conversion device 12 similar to that of Example 1, which is shown in FIG. 3, was manufactured. The device in Comparative Example 2 was manufactured in the same manner as in Example 1, except the first interface layer 32, which is a substantially intrinsic amorphous silicon semiconductor layer, was formed to have a thickness of 50 nm.

Example 5

Figure 5:
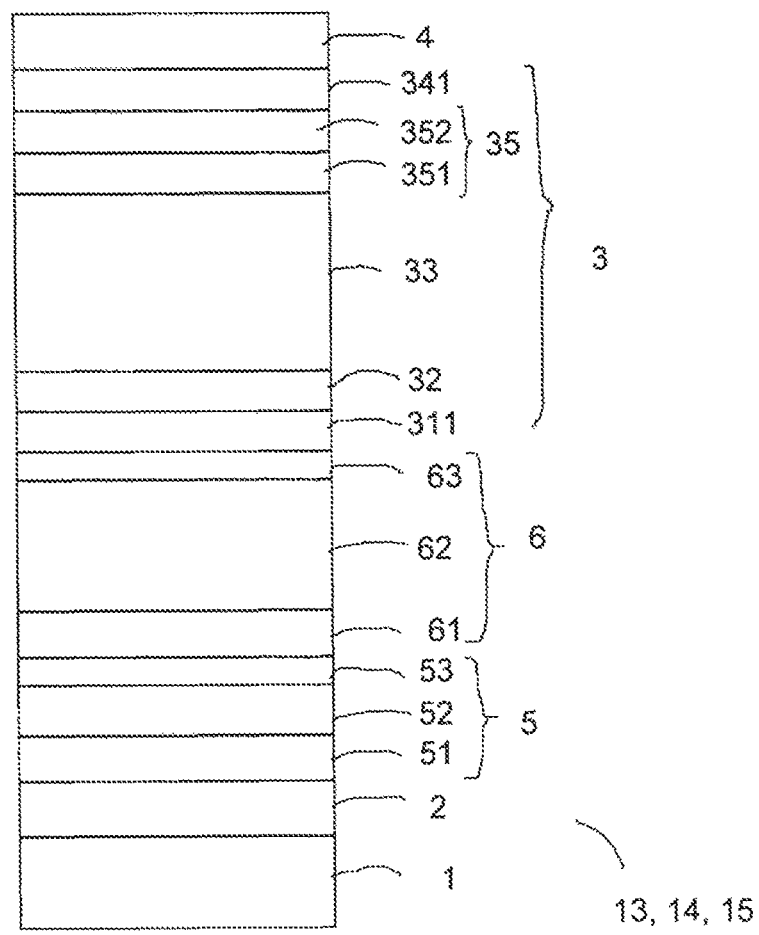
FIG. 5 is a schematic cross-sectional view that shows a triple-junction thin-film photoelectric conversion device of Examples 5-7 of the invention.

A triple-junction thin-film photoelectric conversion device 13 having a configuration shown in FIG. 5 was manufactured in Example 5. The device in Example 5 was manufactured in the same manner as in Example 1 except for the three points of (1) disposing an amorphous silicon photoelectric conversion unit 5 and a crystalline silicon photoelectric conversion unit 6 sequentially between the transparent electrode layer 2 and the crystalline germanium photoelectric conversion unit 3 of Example 1, (2) setting the thickness of the crystalline germanium photoelectric conversion layer 33 to 1 μm, and (3) forming the transparent electrode layer 2 with SnO$_2$ only.

First, on a transparent substrate 1, only SnO$_2$ was formed as a transparent electrode layer 2.

On the transparent electrode layer 2, an amorphous silicon photoelectric conversion unit 5 was formed by using a plasma-enhanced CVD apparatus. After SiH$_4$, H$_2$, CH$_4$, and B$_2$H$_6$ were introduced as reaction gases to form a p-type amorphous silicon carbide layer 51 at a thickness of 15 nm; SiH$_4$ was introduced as a reaction gas to form a substantially intrinsic amorphous silicon photoelectric conversion layer 52 at a thickness of 80 nm. Thereafter, SiH$_4$, H$_2$, and PH$_3$ were introduced as reaction gases to form an n-type amorphous silicon layer 53 at a thickness of 10 nm, so as to form the amorphous silicon photoelectric conversion unit 5.

After the formation of the amorphous silicon photoelectric conversion unit 5, SiH$_4$, H$_2$, and B$_2$H$_6$ were introduced as reaction gases to form a p-type microcrystalline silicon layer 61 at a thickness of 10 nm. Then, SiH$_4$, and H$_2$ were introduced as reaction gases to form a substantially intrinsic crystalline silicon photoelectric conversion layer 62 at a thickness of 1.5 μm. Thereafter, SiH$_4$, H$_2$, and PH$_3$ were introduced as reaction gases to form an n-type microcrystalline silicon layer 63 at a thickness of 15 nm, so as to form the crystalline silicon photoelectric conversion unit 6.

After the formation of the crystalline silicon photoelectric conversion unit 6, the crystalline germanium photoelectric conversion unit 3 and the back electrode layer 4 were sequentially formed.

Example 6

In Example 6, a triple-junction thin-film photoelectric conversion device 14 shown in FIG. 5 was manufactured. The device in Example 6 was manufactured in the same manner as in Example 5 except the deposition temperature of the crystalline germanium photoelectric conversion layer 33 was set to 250° C.

Example 7

In Example 7, a triple-junction thin-film photoelectric conversion device 15 shown in FIG. 5 was manufactured. The device in Example 7 was manufactured in the same manner as in Example 5 except the deposition temperature of the crystalline germanium photoelectric conversion layer 33 was set to 120° C.

Comparative Example 3

Figure 6:
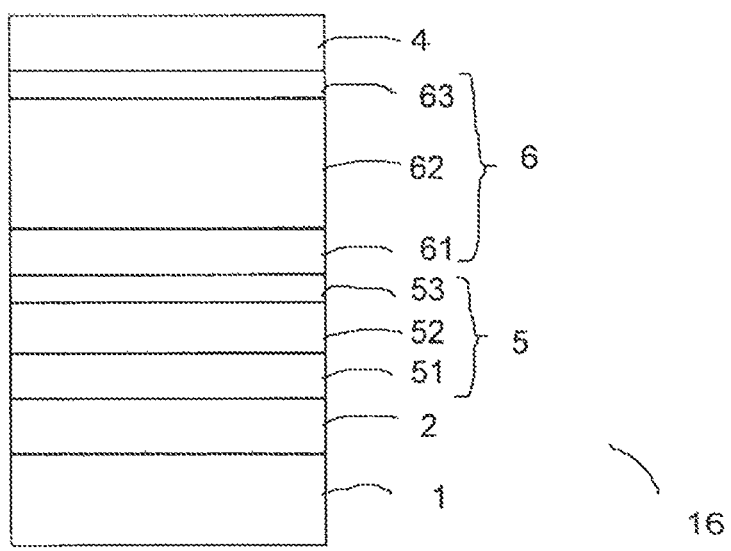
FIG. 6 is a schematic cross-sectional view that shows a double-junction thin-film photoelectric conversion device of Comparative Example 3 of the invention.

In Comparative Example 3, a double junction thin-film photoelectric conversion device 16 having a configuration shown in FIG. 6 was manufactured. The device in Comparative Example 3 was manufactured in the same manner as in Example 5, except that the crystalline germanium photoelectric conversion unit 3 was not formed.

Comparative Example 4

In Comparative Example 4, a triple-junction thin-film photoelectric conversion device similar to that of Example 5 was manufactured. The device in Comparative Example 4 was manufactured in the same manner as in Example 5, except the device had a configuration without forming the first interface layer 32 in the crystalline germanium photoelectric conversion unit.

Comparative Example 5

In Comparative Example 5, a triple-junction thin-film photoelectric conversion device similar to that of Example 5, which is shown in FIG. 5, was manufactured. The device in Comparative Example 5 was manufactured in the same manner as in Example 5, except the first interface layer 32, which is a substantially intrinsic amorphous silicon semiconductor layer, was formed to have a thickness of 50 nm.

Light of AM 1.5 was irradiated on the thin-film photoelectric conversion devices (light-receiving area of 1 cm$^2$) of Examples 1 to 7 and Comparative Examples 1 to 5 obtained in the above-described manner at 100 mW/cm$^2$ and the output characteristics were measured. The thickness of the first interface layer, the temperature for forming the crystalline germanium photoelectric conversion layer, and the output characteristics (open-circuit voltage (Voc), short circuit current density (Jsc), fill factor (FF), conversion efficiency (Eff), and quantum efficiency at a wavelength of 1000 nm ($\eta$@ 1000 nm)) in each of the Examples and Comparative Examples are summarized in Table 1.

electric conversion devices of Examples 1 to 4 and Comparative Examples 1 to 2. When the thickness of the first interface layer 32, which is a substantially intrinsic amorphous silicon semiconductor layer, was within a range from 1 nm to 20 nm, the quantum efficiency at a wavelength of 1000 nm was 15% or higher. In contrast, in the case where the first interface layer 32, which is a substantially intrinsic amorphous silicon semiconductor layer, was absent (Comparative Example 1), and in the case where the first interface layer 32, which is a substantially intrinsic amorphous silicon semiconductor layer, had a thickness of 50 nm (Comparative Example 2), the quantum efficiency at a wavelength of 1000 nm showed a low value of 5% or less.

Figure 8:
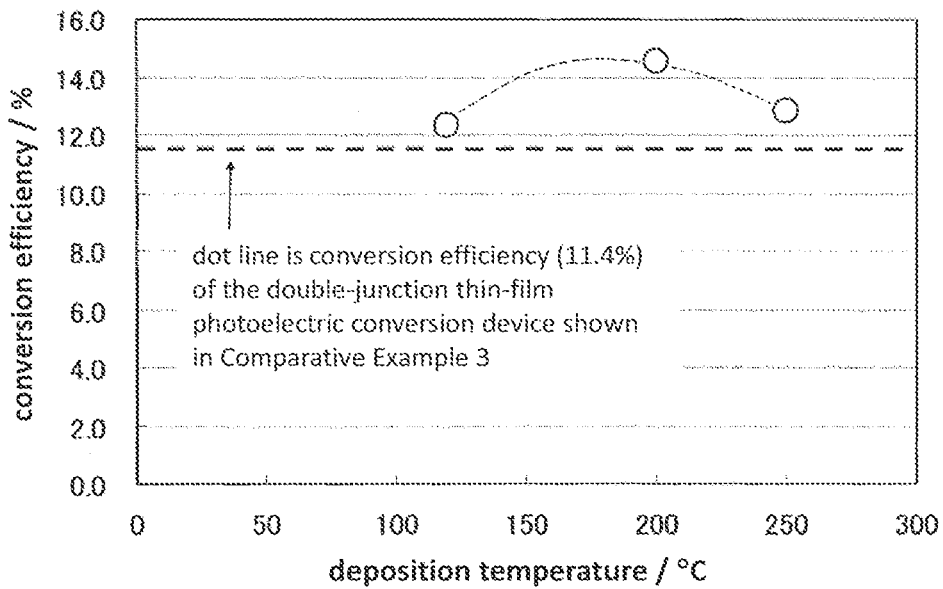
FIG. 8 is a graph illustrating a relation between deposition temperature of crystalline germanium photoelectric conversion layer and conversion efficiency of the triple-junction thin-film photoelectric conversion devices of Examples 5-7.

FIG. 8 shows a relationship between the deposition temperature of the crystalline germanium photoelectric conversion layer and the conversion efficiency, with respect to the triple-junction thin-film photoelectric conversion devices of Examples 5 to 7. When the deposition temperature of the crystalline germanium photoelectric conversion layer was within a range of 120° C. or higher and 250° C. or lower (Examples 5 to 7), the thin-film photoelectric conversion devices showed a higher conversion efficiency than the double-junction thin-film photoelectric conversion device of Comparative Example 3.

DESCRIPTION OF REFERENCE CHARACTERS

1. Transparent substrate
2. Transparent electrode layer
3. Crystalline germanium photoelectric conversion unit
31. p-type semiconductor layer
311. p-type microcrystalline silicon layer
32. First interface layer, a substantially intrinsic amorphous silicon semiconductor layer
33. Crystalline germanium photoelectric conversion layer

TABLE 1

| | | first interface layer (nm) | temperature (° C.) | Jsc (mA/cm$^2$) | Voc (V) | FF | Eff (%) | $\eta$ @ 1000 nm (%) |
|---|---|---|---|---|---|---|---|---|
| Example 1 | single-junction | 10 nm | 200 | 35.2 | 0.35 | 0.55 | 6.8 | 41 |
| Example 2 | single-junction | 1 nm | 200 | 29.6 | 0.23 | 0.52 | 3.6 | 34 |
| Example 3 | single-junction | 1 nm | 200 | 15.0 | 0.13 | 0.30 | 0.6 | 18 |
| Example 4 | single-junction | 20 nm | 200 | 25.4 | 0.32 | 0.44 | 3.6 | 23 |
| Comparative Example 1 | single-junction | None | 200 | 7.2 | 0.08 | 0.26 | 0.1 | 4 |
| Comparative Example 2 | single-junction | 50 nm | 200 | 5.43 | 0.31 | 0.32 | 0.5 | 2 |
| Example 5 | triple-junction | 10 nm | 200 | 12.0 | 1.68 | 0.72 | 14.5 | — |
| Example 6 | triple-junction | 10 nm | 250 | 11.8 | 1.62 | 0.67 | 12.8 | — |
| Example 7 | triple-junction | 10 nm | 120 | 10.5 | 1.65 | 0.71 | 12.3 | — |
| Comparative Example 3 | double-junction | — | — | 11.5 | 1.38 | 0.72 | 11.4 | — |
| Comparative Example 4 | triple-junction | None | 200 | 7.0 | 1.46 | 0.51 | 5.2 | — |
| Comparative Example 5 | triple-junction | 50 nm | 200 | 4.9 | 1.63 | 0.44 | 3.5 | — |

Figure 7:
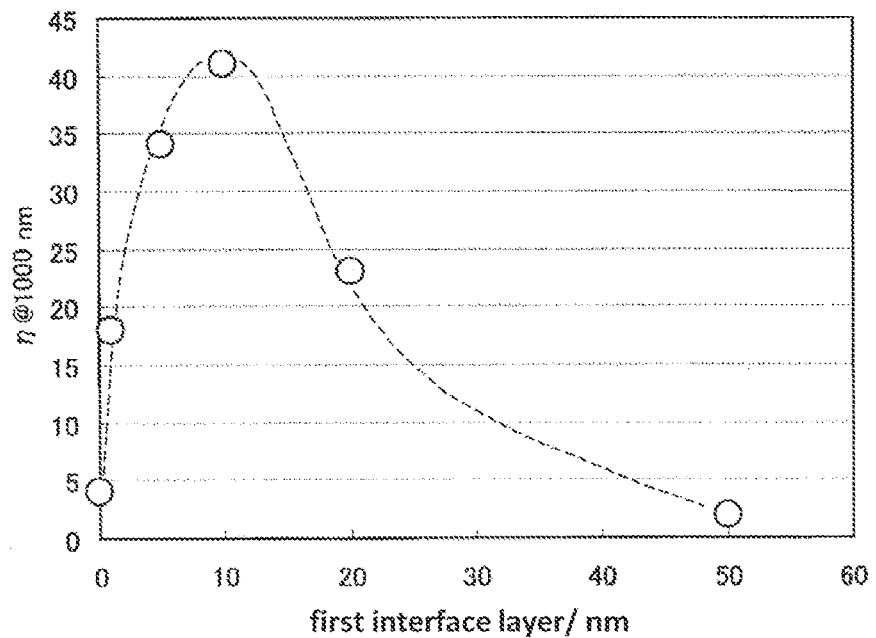
FIG. 7 is a graph illustrating a relation between thickness of the first interface layer and quantum efficiency at a wavelength of 1000 nm of the thin-film photoelectric conversion devices of Examples 1-4 and Comparative Examples 1-2.

FIG. 7 shows a relationship between the thickness of the first interface layer 32 of substantially intrinsic amorphous silicon semiconductor layer and the quantum efficiency at a wavelength of 1000 nm, with respect to the thin-film photo- 34. n-type semiconductor layer
341. n-type amorphous silicon layer
35. Second interface layer
351. Substantially intrinsic crystalline silicon layer 352. Substantially intrinsic amorphous silicon layer
4. Back electrode layer
5. Amorphous silicon photoelectric conversion unit
51. p-type amorphous silicon carbide layer
52. Substantially i-type amorphous photoelectric conversion layer
53. n-type amorphous silicon layer
6. Crystalline silicon photoelectric conversion unit
61. p-type microcrystalline silicon layer
62. Substantially i-type crystalline silicon photoelectric conversion layer
63. n-type microcrystalline silicon layer
7-12. Single-junction photoelectric conversion device
13-15. Triple-junction photoelectric conversion device
16. Double-junction photoelectric conversion device

The invention claimed is:

1. A thin-film photoelectric conversion device, comprising: a first electrode layer; one or more photoelectric conversion units; and a second electrode layer, arranged in this order on a substrate,
   each photoelectric conversion unit comprising a photoelectric conversion layer sandwiched between a p-type semiconductor layer and an n-type semiconductor layer, wherein
   at least one photoelectric conversion unit is a crystalline germanium photoelectric conversion unit including a crystalline germanium photoelectric conversion layer,
   the crystalline germanium photoelectric conversion layer is a substantially intrinsic or a weak n-type layer consisting of a crystalline germanium semiconductor layer essentially free of silicon atoms,
   a first interface layer comprising a substantially intrinsic amorphous silicon semiconductor layer is arranged between the p-type semiconductor layer and the crystalline germanium photoelectric conversion layer in the crystalline photoelectric conversion unit, and
   the first interface layer has a thickness in the range of 1 nm or more and 20 nm or less.

2. The thin-film photoelectric conversion device according to claim 1, wherein the first interface layer has a hydrogen concentration, detected by secondary ion mass spectroscopy, of $7\times10^{21}$ atom/cm$^3$ or more and $1.5\times10^{22}$ atom/cm$^3$ or less.

3. The thin-film photoelectric conversion device according to claim 1, wherein the p-type semiconductor layer is arranged on the crystalline germanium semiconductor layer at a side close to the substrate, and the n-type semiconductor layer is arranged on the crystalline germanium semiconductor layer at a side far from the substrate.

4. The thin-film photoelectric conversion device according to claim 1, wherein the crystalline germanium photoelectric conversion layer has a thickness in the range of 50 nm or more and 100 nm or less.

5. The thin-film photoelectric conversion device according to claim 1, wherein a second interface layer consisting of a substantially intrinsic non-single crystal silicon semiconductor layer is arranged between the n-type semiconductor layer and the crystalline germanium photoelectric conversion layer.

6. The thin-film photoelectric conversion device according to claim 5, wherein the second interface layer is a layer comprising: a substantially intrinsic amorphous silicon semiconductor layer; and a substantially intrinsic crystalline silicon layer, arranged in this order from a side close to the n-type semiconductor layer.

7. The thin-film photoelectric conversion device according to claim 1, wherein the p-type semiconductor layer of the crystalline germanium photoelectric conversion unit is one or more selected from the group consisting of crystalline silicon, amorphous silicon, crystalline silicon germanium, amorphous silicon germanium, crystalline germanium and amorphous germanium.

8. The thin-film photoelectric conversion device according to claim 7, wherein the p-type semiconductor layer is crystalline silicon.

9. The thin-film photoelectric conversion device according to claim 1, wherein the n-type semiconductor layer of the crystalline germanium photoelectric conversion unit is one or more selected from the group consisting of crystalline silicon, amorphous silicon, crystalline silicon germanium, amorphous silicon germanium, crystalline germanium and amorphous germanium.

10. The thin-film photoelectric conversion device according to claim 9, wherein the n-type semiconductor layer is amorphous silicon.

11. The thin-film photoelectric conversion device according to claim 1, wherein, between a transparent electrode layer and the crystalline germanium photoelectric conversion unit, an amorphous silicon photoelectric conversion unit and a crystalline silicon photoelectric conversion unit are arranged in this order from a light incident side.

12. A method for producing a thin-film photoelectric conversion device, the method comprising:
   arranging a first electrode layer, one or more photoelectric conversion units, and a second electrode layer, in this order on a substrate, each photoelectric conversion unit comprising a photoelectric conversion layer sandwiched between a p-type semiconductor layer and an n-type semiconductor layer, wherein at least one photoelectric conversion unit is a crystalline germanium photoelectric conversion unit including a crystalline germanium photoelectric conversion layer, the crystalline germanium photoelectric conversion layer being a substantially intrinsic or a weak n-type layer consisting of a crystalline germanium semiconductor layer essentially free of silicon atoms;
   providing a first interface layer comprising a substantially intrinsic amorphous silicon semiconductor layer that is arranged between the p-type semiconductor layer and the crystalline germanium photoelectric conversion layer in the crystalline photoelectric conversion unit, wherein the first interface layer has a thickness in the range of 1 nm or more and 20 nm or less; and
   forming the crystalline germanium photoelectric conversion layer by a plasma-enhanced CVD method with a substrate temperature being within a range from 120° C. or higher and 250° C. or lower.

13. The method for producing the thin-film photoelectric conversion device according to claim 12, wherein
   in the step of forming the crystalline germanium photoelectric conversion layer by the plasma-enhanced CVD method, a gas is supplied to a deposition chamber through a shower plate which is a plate perforated with numerous open holes, and a flow velocity of the gas at a time when the gas passes through the shower plate is set to 0.1 m/s or more and 10 m/s or less.

14. A method for producing a thin-film photoelectric conversion device, the method comprising:
   arranging a first electrode layer, an amorphous silicon photoelectric conversion unit, a crystalline silicon photoelectric conversion unit, a crystalline germanium photoelectric conversion unit, and a second electrode layer, in this order on a substrate, each photoelectric conversion unit comprising a photoelectric conversion layer sandwiched between a p-type semiconductor layer and an n-type semiconductor layer, the crystalline germanium photoelectric conversion unit including a crystalline germanium photoelectric conversion layer, wherein the crystalline germanium photoelectric conversion layer is a substantially intrinsic or a weak n-type layer consisting of a crystalline germanium semiconductor layer essentially free of silicon atoms;

providing a first interface layer comprising a substantially intrinsic amorphous silicon semiconductor layer that is arranged between the p-type semiconductor layer and the crystalline germanium photoelectric conversion layer in the crystalline photoelectric conversion unit, wherein the first interface layer has a thickness in the range of 1 nm or more and 20 nm or less, and wherein between a transparent electrode layer and the crystalline germanium photoelectric conversion unit, the amorphous silicon photoelectric conversion unit and the crystalline silicon photoelectric conversion unit are arranged in this order from a light incident side; and forming the crystalline germanium photoelectric conversion layer by a plasma-enhanced CVD method with a substrate temperature being within a range from 120° C. or higher and 250° C. or lower, wherein in the step of forming the crystalline germanium photoelectric conversion layer by the plasma-enhanced CVD method, a gas is supplied to a deposition chamber through a shower plate which is a plate perforated with numerous open holes, and a flow velocity of the gas at a time when the gas passes through the shower plate is set to 0.1 m/s or more and 10 m/s or less.

* * * * *